US 8,944,854 B2

(12) United States Patent
Terhune, IV

(10) Patent No.: US 8,944,854 B2
(45) Date of Patent: Feb. 3, 2015

(54) ELECTRICAL CONNECTOR WITH LOW PROFILE

(71) Applicant: Albert Harvey Terhune, IV, Chandler, AZ (US)

(72) Inventor: Albert Harvey Terhune, IV, Chandler, AZ (US)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 36 days.

(21) Appl. No.: 13/757,736

(22) Filed: Feb. 2, 2013

(65) Prior Publication Data

US 2014/0220829 A1    Aug. 7, 2014

(51) Int. Cl.
*H01R 24/00* (2011.01)
*H05K 7/10* (2006.01)

(52) U.S. Cl.
CPC ........................................ *H05K 7/10* (2013.01)
USPC ......................................................... 439/660

(58) Field of Classification Search
USPC .................... 439/660, 331, 68–73, 326–327, 439/525–526, 940, 135, 342, 260–265, 248
See application file for complete search history.

(56) References Cited

U.S. PATENT DOCUMENTS

| 6,431,899 | B1* | 8/2002 | Keller ............................ | 439/342 |
| 7,001,197 | B2 | 2/2006 | Shirai et al. | |
| 8,075,327 | B2* | 12/2011 | Zhou et al. .................... | 439/248 |
| 8,142,201 | B2* | 3/2012 | Fan ................................ | 439/41 |
| 8,144,469 | B2* | 3/2012 | Kyle et al. ..................... | 361/704 |
| 8,439,694 | B2* | 5/2013 | Yeh et al. ...................... | 439/135 |
| 2004/0032720 | A1* | 2/2004 | McHugh et al. .............. | 361/719 |

* cited by examiner

*Primary Examiner* — Jean F Duverne
(74) *Attorney, Agent, or Firm* — Wei Te Chung; Ming Chieh Chang

(57) ABSTRACT

An electrical connector for use with an electronic package, includes a base plate and a top housing. The base plate has a number of contacts with mating portions extending upward beyond a top surface of base plate. The top housing has a plurality of through holes corresponding to the contacts and receives the mating portions. The top housing defines a pair of channels to allow the electronic package moving relative to the top housing in a horizontal direction, and then the top housing with the electronic package move relative to the base plate in a vertical direction such that the mating portions protrude from a top surface of the top housing and contact with the electronic package.

10 Claims, 7 Drawing Sheets

ELECTRICAL CONNECTOR WITH LOW PROFILE

BACKGROUND OF THE INVENTION

1. Field of the invention

The present invention relates to an electrical connector, and more particularly to an electrical connector with a low profile to electrically connect an electronic package.

2. Description of Related Art

U.S. Pat. No. 7,001,197 issued to Shirai et al. on Feb. 26, 2006 discloses an electrical connector having an insulative housing with a plurality of contacts received therein. The contacts have mating portions extending beyond top surface of the insulative housing to contact with an electronic package. A cover member is pivotally mounted on a first end of the insulative housing. The cover member is pivotal between an open position and a closed position where the cover member presses the land grid array package toward the top surface of the insulative housing so that the land grid array package electrically connects to the contacts. A lever is pivotally mounted on a second end of the insulative housing. The lever has a locking portion for locking the cover member in the closed position. A metallic reinforcing plate is positioned on a bottom surface of the housing. The metallic reinforcing plate extends between the first end and the second end of the insulative housing.

However, the electronic package mounted on the insulative housing need to pivotally open and close the cover member such that a large room is needed. For the trend toward miniaturization, the electrical connector said above need to be improved.

Therefore, an improved electrical connector is needed.

SUMMARY OF THE INVENTION

An object of the present invention is to provide an electrical connector having top housing with protrusions to lock the electronic package such that the electrical connector has a low profile.

According to one aspect of the present invention, an electrical connector for use with an electronic package, comprises a base plate and a top housing. The base plate has a plurality of contacts with mating portions extending upward beyond a top surface of base plate. The top housing has a plurality of through holes corresponding to the contacts and receiving the mating portions. The top housing defines a pair of channels to allow the electronic package moving relative to the top housing in a horizontal direction, and then the top housing with the electronic package move relative to the base plate in a vertical direction such that the mating portions protrude from a top surface of the top housing and contact with the electronic package.

According to another aspect of the present invention, an electrical connector for electrically connecting an electronic package to a printed circuit board, comprises a base plate. A plurality of contacts are disposed in the base plate and have mating portions extending upward. A top housing has a plurality of through holes to allow the mating portions received therein and the top housing has a plurality of protrusions for locking the electronic package in a vertical direction. The top housing is located upon the base plate with a gap formed between so as to the top housing can move downwardly to allow the mating portion extend beyond a top surface of the top housing.

Other objects, advantages and novel features of the invention will become more apparent from the following detailed description of a preferred embodiment when taken in conjunction with the accompanying drawings.

DETAILED DESCRIPTION OF THE INVENTION

Figure 1:
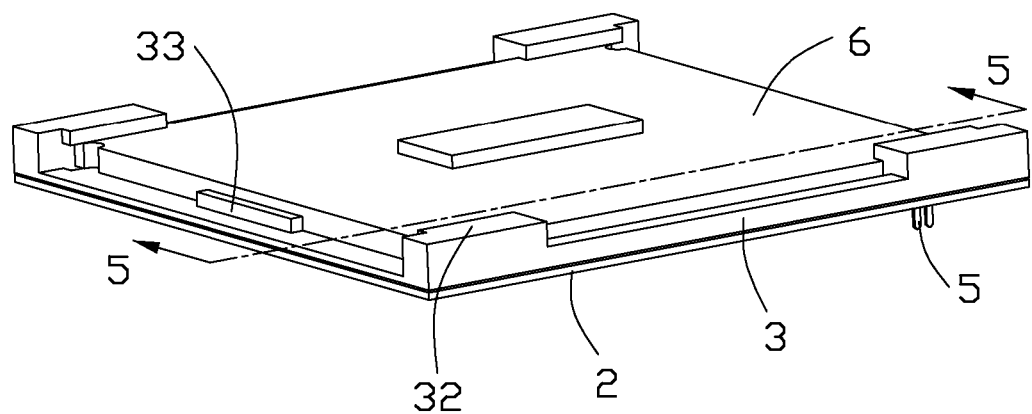
FIG. 1 is an assembled, perspective view of an electrical connector with an electronic package in accordance with the present invention.

Referring to FIG. 1 to FIG. 5 show an electrical connector in accordance with a first embodiment. The electrical connector used for electrically connecting an electronic package 6 and a Printed Circuit Board (PCB) 7, comprises a base plate 2, a top housing 3 mounted on the base plate 2, elastomers 4, and a plurality of contacts 5 received in the base plate 2.

The base plate 2 and the top housing 3 may be formed, for example, by insulative synthetic resin. The base plate 2 is substantially rectangular in shape. A plurality of passageways 20 are formed on the base plate 2 and extend substantially vertically through the base plate 2. The passageways 20 are arranged in the form of matrix. The contacts 5 are press-fit to the passageways 20. Alternatively, the contacts 5 also can be insert-molding into the base plate 2.

Figure 5:
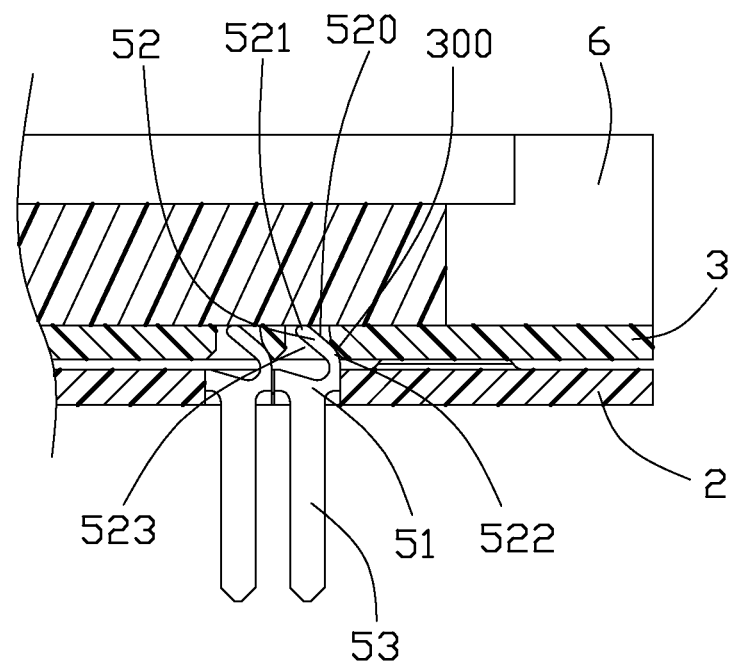
FIG. 5 is a cross-sectional view taken along line 5- of FIG. 1 shown a contact mounted in a base plate in accordance with the first embodiment.
Figure 6:
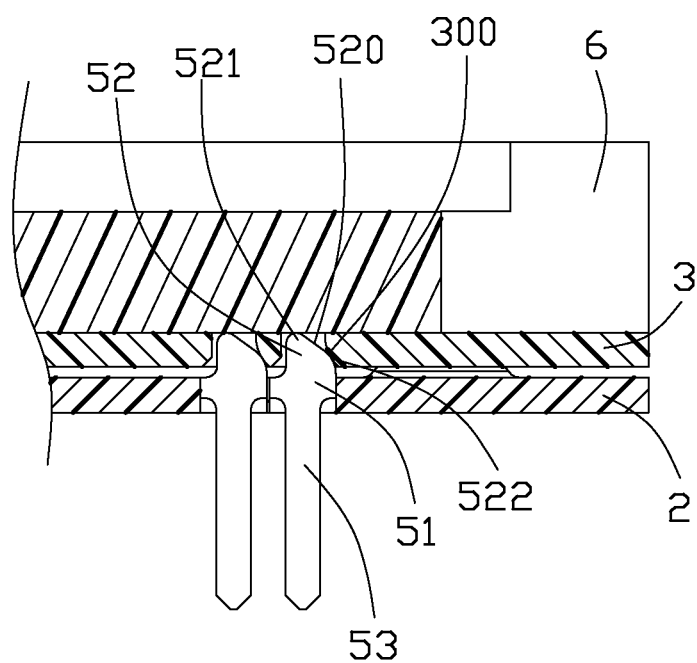
FIG. 6 is similar with FIG. 5, shown a contact mounted in a base plate in accordance with the second embodiment.
Figure 7:
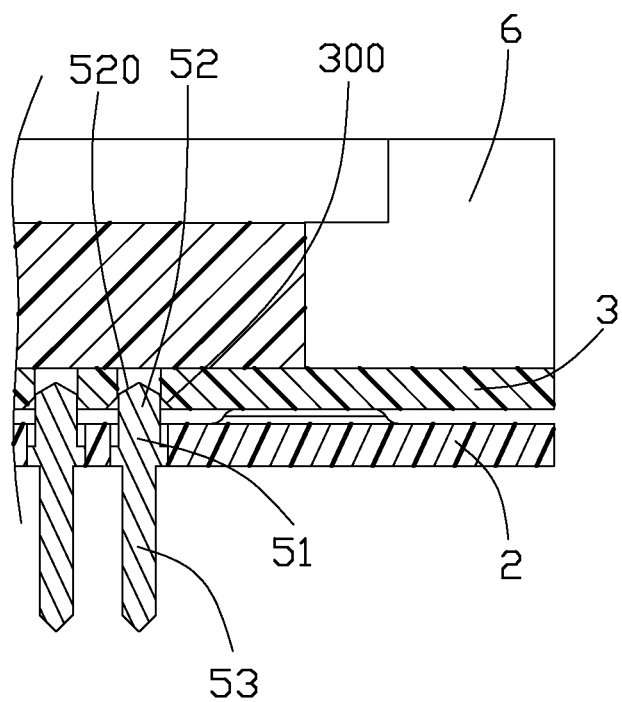
FIG. 7 is similar with FIG. 5, shown the contacts mounted in a base plate in accordance with the third embodiment.

The top housing 3 has a substantially rectangular shape. A plurality of through holes 30 are formed corresponding to the contacts 5 mounted to the base plate 2. Each though hole 30 has a leading feature 300 with a curved feature, as shown in FIGS. 5,6 or a countersink feature, as shown in FIG. 7. The top housing 3 has two channels 31 formed by four handstand L-shaped protrusions 32 located at two opposite sides of top surface of the top housing 3. A stopper 33 is formed at a side of the top housing 3 perpendicular to the sides that defined the channels 31.

Referring to FIG. 5, each contact 5 has a retention portion 51 secured in the passageway 20 or inserting molded in the base plate 2. A mating portion 52 extends upwardly from the retention portion 51 and further into the through hole 30 of the top housing 3. A solder portion 53 extends downwardly out of the base plate 2 to weld to the PCB 7.

The contacts 5 has flake configurations. The mating portions 52 have slant surfaces 520 formed a mating point 521 at top end to electrically connect the electronic package 6 and formed a curved portion 522 at bottom end to slide across the leading feature 300 of the top housing 3 to translate a vertical and a horizontal wiping actions when a heat sink (not shown) assembled to the electrical connector and the electronic package 6.

Figure 2:
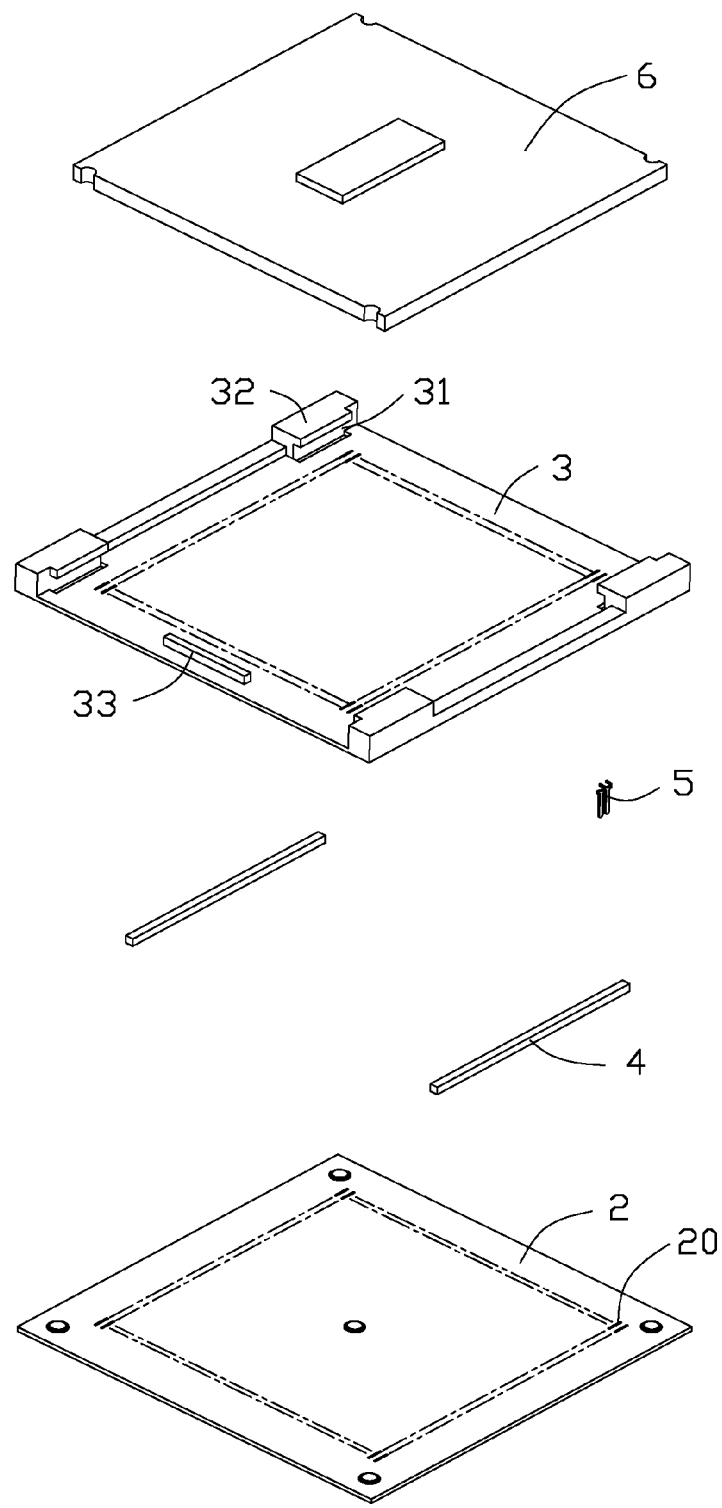
FIG. 2 is an exposed view of the electrical connector shown in FIG. 1.

Referring to FIG. 2, the electronic package 6 is inserted along the channels 31 of the top housing 3 and stopped by the stopper 33. The electronic package 6 is restrained below the protrusions 32 such that maintain the height in a vertical direction as well as provide a hard-stop when the contacts 5 apply a force to a bottom side of the electrical package 6 so that the electrical package 6 will not freely fallout.

Figure 3:
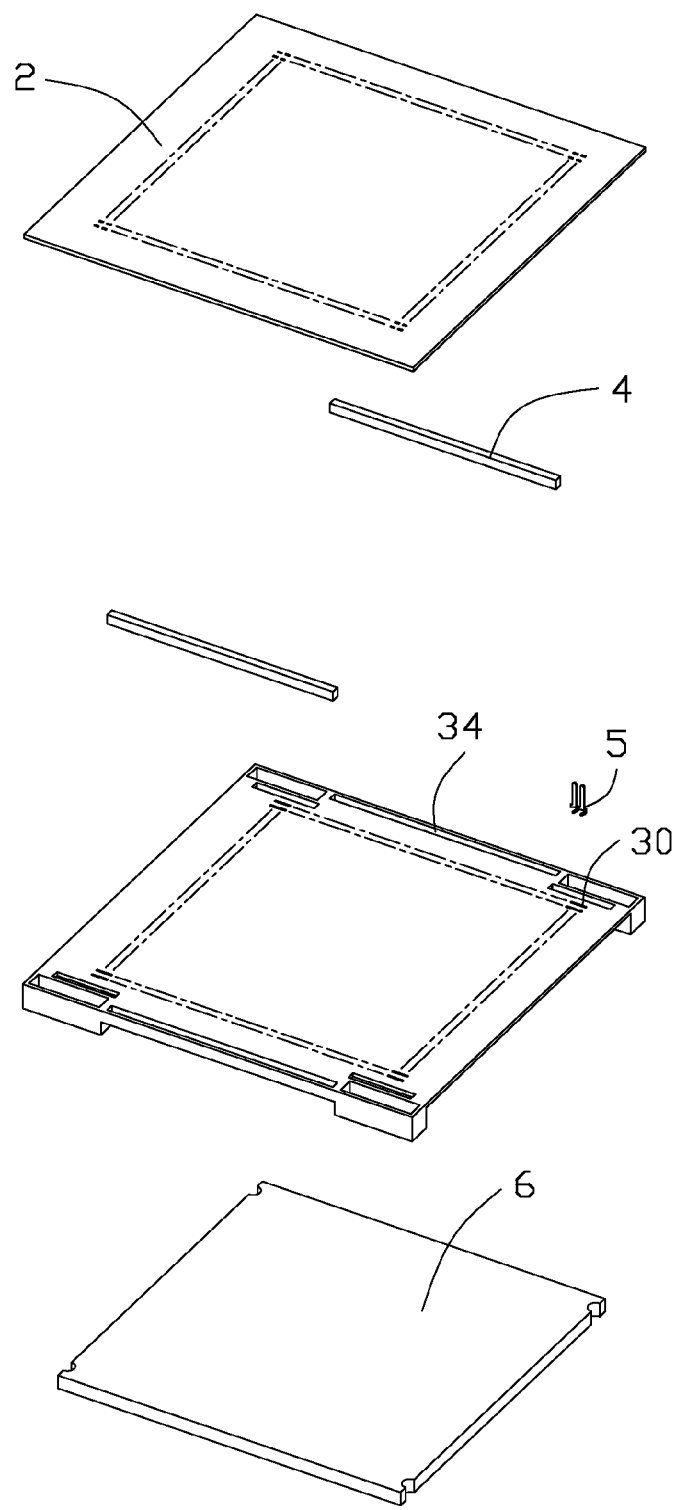
FIG. 3 is an another exposed view of the electrical connector shown in FIG. 2.
Figure 4:
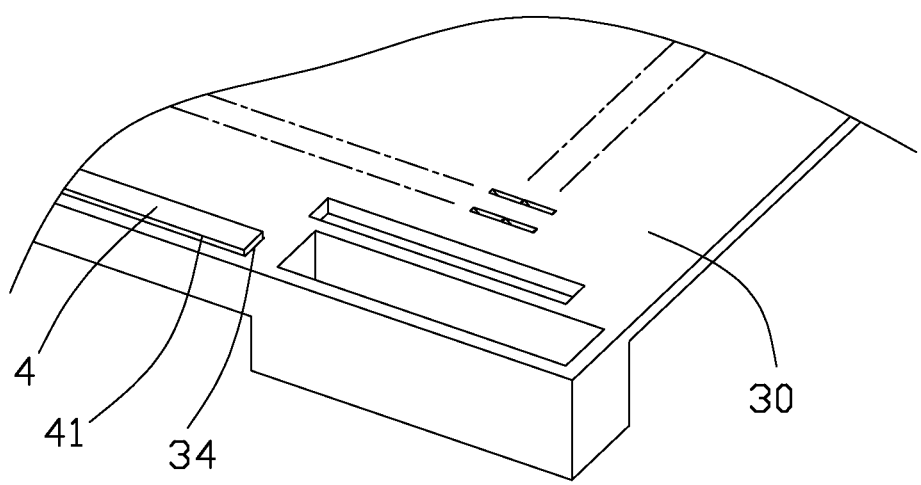
FIG. 4 is a perspective view shown an elastomer mounted in a top housing.

As shown in FIGS. 3-4, two elastomers 4 are disposed between the top housing 3 and the base plate 2 such that a gap 40 is formed therebetween. The top housing 3 defines two elongated recesses 34 at bottom surface to receive the elastomers 4 when the top housing 3 is compressed. The top housing 3 and the base plate 2 are attached by the way of adhesive defined on the elastomer's 4 double sided surfaces 41. The elastomer 4 acts as a "spring" for the reaction force between the top housing 3 and base plate 2. The elastomer 4 also maintains the gap 40 and keeps the contacts 5 below top surface of the top housing 3, thus protects the contacts 5 from damaging when the electronic package 6 is inserted into the top housing 3.

The electrical connector and the electronic package 6 mounted to the PCB 7, the end-user will attach the heat sink upon thereof. The heat sink will provide a force to compress the top housing 3 with the electronic package 6 downwardly moving and combined with the base plate 2 such that cause the contacts 5 to engage with pads of the electronic package 6.

The FIG. 6 shows the second embodiments of the present invention. The different between the first and the second embodiments is the structure of the contact 5. The contact 5 in the second embodiment has a same structure substantially with the first embodiment. The contact 5 further has a U-shaped cutout 523, at a side opposite to the slant surface 520, formed on the mating portion 52 such that the mating portion 52 has well elasticity.

The FIG. 7 shows the third embodiment of the present invention. The contact 5 of the third embodiment has a cylinder shape, and also has the retention portion 51, the mating portion 52, and the solder portion 53. The mating portion 52 has the slant surface 520 to slide along with the leading feature 300 of the top housing 3 for rough alignment with the contact 5.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector for use with an electronic package, comprising:
    a base plate having a plurality of contacts with mating portions extending upward beyond a top surface of the base plate;
    a top housing having a plurality of through holes corresponding to the contacts and receiving the mating portions, the top housing defining a pair of channels to allow the electronic package moving relative to the top housing in a horizontal direction, and then the top housing with the electronic package moved relative to the base plate in a vertical direction such that mating portions protrude from a top surface of the top housing and contact with the electronic package.

2. The electrical connector as claimed in claim 1, wherein the two channels are formed by a plurality of handstand L-shaped protrusions located at two opposite sides of a top surface of the top housing.

3. The electrical connector as claimed in claim 1, wherein a stopper is formed at a side of the top housing for stopping the electronic package from horizontally moving.

4. The electrical connector as claimed in claim 1, wherein the top housing and the base plate are kept separated by elastomers disposed therebetween.

5. The electrical connector as claimed in claim 4, wherein a bottom surface of the top housing defines elongated recesses for receiving the elastomers.

6. The electrical connector as claimed in claim 5, wherein each contact has a flake configuration and includes a mating portion having a slant surface, and wherein the slant surface forms a mating point at top end for electrically connect the electronic package and forms a curved portion at bottom end to slide across a leading feature of the top housing.

7. The electrical connector as claimed in claim 6, wherein a U-Shaped cutout is formed on the mating portion at a side opposite to the slant surface.

8. An electrical connector assembly comprising:
    an insulative base;
    an insulative top housing attached upon the base via an elastic member allowing said top housing to up and down move relative to the base;
    a plurality of first through holes formed in the base;
    a plurality of second though holes formed in the top housing and in alignment with the corresponding first through holes, respectively;
    a plurality of contacts each received in the corresponding first through hole and second through hole under condition that each of said contact has a fixed relation with the base while having a floating relation with the top housing between an upper position and a lower position wherein when the top housing is located at the upper position, an upper tip of a deflectable contacting section of each of the contacts is protectively located under a top surface of the top housing;
    a tray structure formed on said top surface of the top housing; and
    an electronic package assembled to said tray structure; wherein
    said electronic package is adapted to be downwardly pressed by a heat sink toward the top housing, so as to actuate said top housing to move downwardly toward the base with deformation of said elastic member and exposure of the upper tip around the top surface of the top housing.

9. The electrical connector assembly as claimed in claim 8, wherein said tray structure is configured to allow the electronic package to be assembled to the top housing in only a horizontal direction.

10. The electrical connector assembly as claimed in claim 8, wherein each of said contacts extends in a planar manner.

* * * * *